United States Patent [19]

Pfeiffer et al.

[11] 4,243,866
[45] Jan. 6, 1981

[54] METHOD AND APPARATUS FOR FORMING A VARIABLE SIZE ELECTRON BEAM

[75] Inventors: Hans C. Pfeiffer, Ridgefield, Conn.; Philip M. Ryan, Hopewell Junction; Edward V. Weber, Poughkeepsie, both of N.Y.

[73] Assignee: International Business Machines Corporation, Armonk, N.Y.

[21] Appl. No.: 2,499

[22] Filed: Jan. 11, 1979

Related U.S. Application Data

[63] Continuation of Ser. No. 771,235, Feb. 23, 1977, abandoned.

[51] Int. Cl.³ .................. B23K 15/00; G21K 1/08
[52] U.S. Cl. .................. 219/121 EK; 219/121 EJ; 219/121 ET; 219/121 ER; 250/396 R; 250/492 A
[58] Field of Search ............... 219/121 EB, 121 EM; 315/31 R, 383, 384; 250/396 R, 396 ML, 398; 346/74 EB

[56] References Cited

U.S. PATENT DOCUMENTS

| | | | |
|---|---|---|---|
| 3,638,231 | 1/1972 | Le Poole et al. | 219/121 EB |
| 3,644,700 | 2/1972 | Kruppa et al. | 219/121 EB |
| 3,864,597 | 2/1975 | Trotel | 219/121 EB X |
| 3,894,271 | 7/1975 | Pfeiffer et al. | 219/121 EB |
| 3,949,228 | 4/1976 | Ryan | 219/121 EM |
| 4,145,597 | 3/1979 | Yasuda | 219/121 EB |

*Primary Examiner*—B. A. Reynolds
*Assistant Examiner*—M. Paschall
*Attorney, Agent, or Firm*—James M. Thomson; James R. McBride

[57] ABSTRACT

In electron beam apparatus having a souce of electrons and a target area toward which the electrons are directed, electron beam forming means are provided along the path from the source to the target. These forming means include a first beam shaping member having a first spot shaping aperture therein, a second beam shaping member having a second spot shaping aperture therein, and means focusing the image of the first aperture in the plane of the second aperture to thereby form a composite spot shape defined by the image of the first aperture and the second aperture. Further means are provided for focusing the image of the composite spot in the target area.

Preferably, the apertures are square shaped. Thus, by varying the position of the superimposed image of the first aperture with respect to the second aperture, a wide variety of rectangular shaped composite spots with different dimensions is obtainable. This permits the exposure of rectilinear patterns, e.g., in photoresists of integrated circuit fabrication, by the electron beam with a minimum of exposure steps and substantially no exposure overlap. The result is greatly increased speed in the total exposure of such rectilinear areas to the electron beam as well as a minimum of the "blooming effects" produced by exposure overlap.

28 Claims, 9 Drawing Figures

METHOD AND APPARATUS FOR FORMING A VARIABLE SIZE ELECTRON BEAM

This is a continuation of application Ser. No. 771,235 filed Feb. 23, 1977, now abandoned.

BACKGROUND OF THE INVENTION

The present invention relates to electron beam columns and more particularly to electron beam column apparatus and methods in which size and shape of a beam may be effectively varied during the operation of the electron beam column.

Electron beam columns have been adapted for use in systems for the microfabrication of large-scale integrated semiconductor circuits. For example, U.S. Pat. No. 3,644,700, issued Feb. 22, 1972, to Kruppa et al., describes an electron beam column adapted to form or "write" selected patterns on semiconductor wafers. Such columns have particular utility in the writing of such patterns on photoresists, i.e, exposing selected areas on photoresists which are then developed to form the photoresist masks extensively used in a wide variety of operations during integrated circuit fabrication. The typical electron beam columns utilized in connection with such integrated circuit microfabrication applications generally include an electron beam source, condenser lenses, alignment stages, demagnification lens stages, a projection lens, a deflection unit, and a target area, arranged in well-known fashion. Typical electron beam columns and components thereof are further described in U.S. Pat. No. 3,949,228, Ryan, issued Apr. 6, 1976, and U.S. Pat. No. 3,984,678, Loeffler et al, issued Oct. 5, 1976. Typical optical systems and components for such columns are further described in U.S. Pat. No. 3,930,181 and in the publication, "New Imaging and Deflection Concept for Probe-Forming Microfabrication Systems", H. C. Pfeiffer, *J. Vac. Sci. Technol.*, November/December 1975, Vol. 12, No. 6, pp. 1170–1173.

The advantages of the square shaped electron beam over the more traditional Gaussian round beam has been set forth in detail in the above Pfeiffer article in the *J. Vac. Sci. Technol.* as well as in the above mentioned patents, U.S. Pat. Nos. 3,644,700 and 3,949,228. As set forth in these teachings, resolution and current density in electron optic systems are determined by the electron optical configuration and are effectively independent of the size of the target image. The Pfeiffer article indicates that a beam of relatively uniform intensity having twenty-five times the area of the usual Gaussian spot at approximately the same edge dose gradient can be obtained by projecting a square shaped beam onto a target.

This result will be summarized with respect to the comparison of the round beam and square shaped beam in FIG. 2 of the present drawings. The comparison illustrates the advantage of a square beam over a Gaussian round beam with identical resolution. In FIG. 2, the shape and size of a Gaussian beam spot 25 is compared to a square shaped beam spot 26 and in the graph beneath each beam spot layout the intensity distribution, i.e., intensity is plotted with respect to spot area. As set forth in the Pfeiffer article, in a conventional round-beam system, the intensity distribution halfwidth (d) equals the spatial resolution. The resolution of a Gaussian round beam is determined by the superposition of all n aberration disks $\delta_i$ plus the demagnified Gaussian source, which typically equals the quadrature sum of the aberrations for optimum current density:

$$d_{Gaussian} = \left( \sum_{i=1}^{n} \delta_{i\ aberrations}^2 + \delta_{Gaussian}^2 \right)^{\frac{1}{2}}.$$

To produce a true copy of the pattern, the half-width of the spot has to be at least five times smaller than the smallest element of the pattern. For the square spot, resolution is determined by the edge slope of the intensity distribution, caused only be the superposition of all n aberration disks:

$$d_{square} = \left( \sum_{i=1}^{n} \delta_{i\ aberrations}^2 \right)^{\frac{1}{2}}.$$

The Gaussian disk of the source does not contribute to the edge shape. The size of the square spot is independent of resolution and can be chosen to match the smallest segment of the pattern. This entire segment is exposed at once, thereby speeding up the exposure rate by a factor of twentyfive over a comparable round-beam system.

It may be seen from FIG. 2 that using the square shaped beam, rectilinear area 27 (i.e., an area defined by straight lines) may be totally exposed by six stepped exposures (1 through 6) with square beam 26 while the same rectilinear area 27' would require in the order of one hundred and forty stepped exposures with the round Gaussian beam 25.

While present shaped or square beam systems provide significant electron beam capability in the integrated circuit fabrication field, it is foreseeable that in future technologies wherein portions of the patterns to be exposed may have dimensions below two microns, the application of the shaped electron beam in forming such patterns may be limited. In such dense integrated circuits having aperture widths and/or line widths with smallest dimensions below two microns, the "blooming effect" produced by double and greater multiple exposures to which some pattern areas may be subject when using shaped aperture apparatus may be beyond the dimensional tolerances of the integrated circuits. The problem of double exposure will be elaborated on in greater detail with respect to FIGS. 3 and 4. However, it may be seen in its simplest form with respect to area 27 which is exposed by the square shaped beam in FIG. 2. Utilizing a beam providing a square shaped spot 26, area 27 is exposed by six stepped exposures. Since the selected area to be exposed does not have dimensions which are integral multiples of spot 26, a portion 28 (crosshatched) will be double exposed. This double exposure results in the known "blooming effect" wherein the double exposed areas, for example, in the photoresist develop at a faster rate than the normal singly exposed areas during development. This produces undercutting and edge irregularity in the remaining photoresist defining the exposed area. With the present integrated circuits having line widths and apertures with smallest pattern dimensions of at least two microns, this "blooming effect" is within dimensional tolerances and presents no problems. However, with the denser, more advanced integrated circuits having lateral dimensions below two microns, the "blooming effect" may produce dimensional irregularities beyond the lateral tolerances.

In addition, in advanced integrated circuit technology, it would be highly desirable if the time required for electron beam exposure of selected patterns could be reduced thereby increasing the integrated circuit fabrication throughput.

SUMMARY OF THE INVENTION

Accordingly, it is a primary object of the present invention to provide a method and apparatus for exposing selected patterns to an electron beam wherein the areas subject to multiple exposure are minimized.

It is another object of the present invention to provide a method and apparatus for exposing selected patterns of substrate areas to an electron beam wherein the speed of the operation is increased while the areas subjected to multiple exposure are minimized.

It is another object of the present invention to provide electron beam apparatus in which the size and the shape of the beam spot applied to the target is readily variable.

It is yet a further object of the present invention to provide a method and apparatus for varying the size and shape of electron beam spot at a target while maintaining a constant beam current density at said target.

The present invention provides apparatus which forms a variable shaped rectilinear beam spot, preferably a rectangular beam spot in which the orthogonal lateral dimensions may be varied. With such a variable spot, the problem of multiple exposure and the resultant "blooming effect" may be completely avoided. Since the dimension of the rectangular spot to which the selected target pattern is exposed is thus variable, the dimensions of the spot at each exposure step may be varied in order to have the maximum dimensions within the limits of the portion of the rectilinear pattern being exposed during said step while only abutting but not overlapping the portion of said pattern exposed in a previous step.

The electron beam shaping apparatus in accordance with the present invention is provided in electron beam apparatus having a source of electrons and a target area or plane toward which the electrons are directed. The electron beam shaping or forming means positioned along the path from the source to the target area comprise a first beam shaping member having a first spot shaping aperture formed therein, a second beam shaping member having a second spot shaping aperture formed therein and means for focusing the image of the first aperture in the plane of the second spot shaping aperture to thereby form a composite spot shape defined by said image and said second aperture. Means are further provided for focusing the image of the composite spot in the target area. The apertures are preferably rectangular in shape so that the composite spot shape will also be rectangular.

In accordance with a more particular aspect of the invention, the apparatus further includes means for deflecting the image of the first aperture laterally with respect to the second aperture and to thereby provide the capability of varying the shape and dimensions of the composite spot. A more specific aspect of the present invention includes means for ensuring that the image of the source in no way interferes with the composite spot shaped defined by the combination of the second aperture and the image of the first aperture. This is accomplished by focusing the image of the source in a plane which is outside of the depth of focus of said first aperture image.

In accordance with another more specific aspect of the present invention, the means for deflecting the image of the first aperture laterally are electrostatic deflection means positioned along the beam path between the first and second apertures.

Further, in accordance with a particularly significant aspect of the present invention, means are provided for ensuring that during the lateral deflection of the first aperture image with respect to the second aperture that all images of the source remain at a fixed location along the identical axial path of the beam. In order for the electron beam apparatus to function effectively, the shaped beam path below the second aperture must remain aligned with respect to the demagnification lens system and the projection lens system which serve to focus the image of the composite spot produced by the combined apparatus on the target. If the beam path does not remain thus constantly aligned, the beam path may move to positions within the demagnification and projection lens systems which are off center. Since only the central portions of such lens systems have sufficient quality to provide optimum focus of the beam, any movement of the beam path away from such optimum positions will degrade the edge resolution of the focused spot. Furthermore, such constant alignment of the beam path is important where the electron beam apparatus utilizes a circular aperture plate along the beam path below the second aperture. Such a plate is standard in some electron beam apparatus such as that described in U.S. Pat. No. 3,644,700 (Plate 20, FIG. 1), where it serves to restrict beam fringes so that only electrons passing through the center of the demagnification lenses are used and spot distortion is thus minimized. When such a round aperture is used, if the beam path is not in constant alignment with respect to this aperture, such a round aperture may intercept a portion of the beam which will reduce the effective aperture angle and hence the current density.

In order to maintain the constant beam path when the image of the first aperture is being deflected laterally, means are provided for focusing the image of the source in a plane between the first and second shaping apertures and for bringing the virtual center of said deflection into coincidence with the plane of the focused source image source.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1:
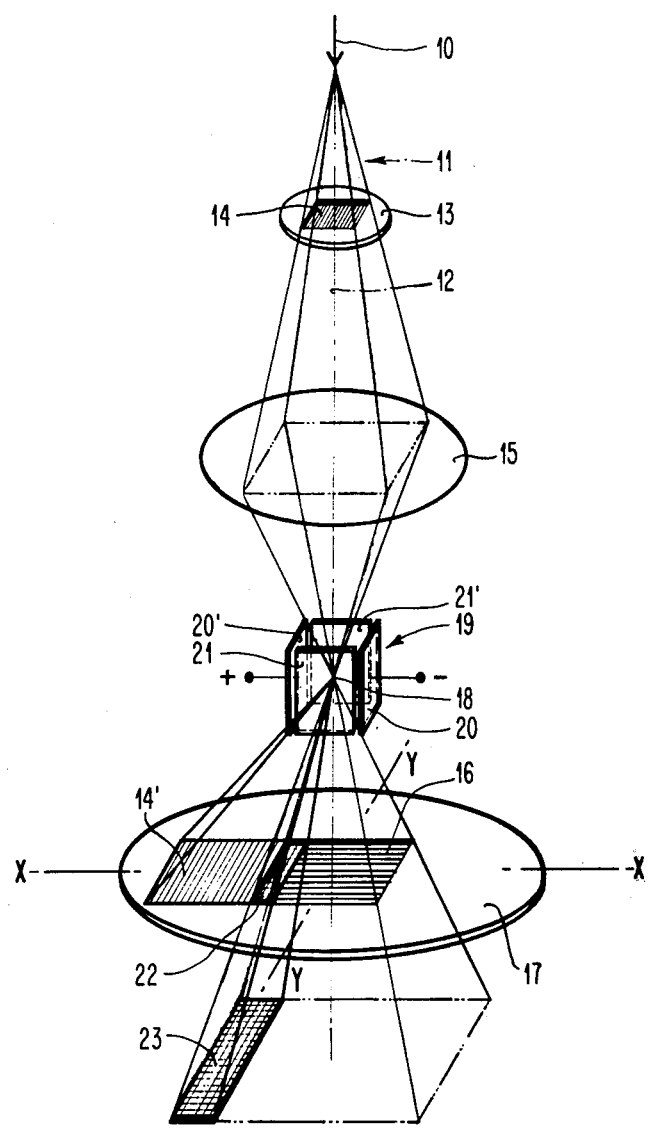
FIG. 1 is a generalized diagrammatic view of the electron beam shaping apparatus in accordance with the present invention.

With reference to FIG. 1, the apparatus for shaping the beam spot will be described in general. An electron source 10 directs a beam of electrons 11 along an axis 12 in an electron beam column toward a target which is not shown. The beam is shaped into a variable rectangular spot by first passing the beam through square aperture 14 in shaping member 13. Condenser lens 15 simultaneously focuses the image 14' in the plane of square aperture 16 of shaping member 17 and focuses the image of the source at a position 18 in a plane coincident with the center of deflection provided by deflection means 19 which move the focused image 14' of the first aperture 14 laterally with respect to aperture 16. In the embodiment of FIG. 1, deflecting means 19 are conventional electrostatic deflection plates with plates 20 and 20' acting to deflect image 14' in the X direction while plates 21, 21' act to deflect image 14' in the Y direction. For optimum results, image 14' has the same dimensions and shape as aperture 16. The final beam spot shape is determined by that portion 22 of image 14' which is not blocked by the plate of shaping member 17 and passes through aperture 16 as shaped composite image 23. While the operation has been illustrated with respect to a deflection in the X direction, it will, of course, be understood that with various combinations of deflections of image 14' in the X and Y direction a wide variety of rectangular shapes may be achieved for composite spot 23.

The variable spot shaping apparatus shown in general in FIG. 1 may be used in combination with standard electron beam columns such as those described in the above mentioned Pfeiffer article in the *J. Vac. Sci. Technol.* or in the Kruppa et al patent, U.S. Pat. No. 3,644,700. When used in such columns, the composite spot 23 may then be passed through demagnification lenses and projection lenses to project the image of spot 23 onto a target. Also, the beam may be deflected in the conventional manner for scanning purposes with respect to such targets. Standard demagnification, projection and deflection equipment such as that described in U.S. Pat. No. 3,644,700 and the Pfeiffer et al article may be used for this purpose.

One important aspect of the apparatus of FIG. 1 which will be discussed in greater detail subsequently with respect to FIGS. 6-9 is the optical separation of the image of source 10 from the image of aperture 14. The image 14' of the aperture is focused in the plane of aperture 16 by condenser lens 15 while the same lens focuses the image of source 10 in a plane near the center of deflection produced by deflection means 19. There will subsequently be described with respect to FIGS. 6-9 how the plane of the image 18 of source 10 is brought into coincidence with the center of deflection. In any event, by such optical separation of the focused images, the illumination, i.e., current density of the beam spot at the target, which is dependent on the position of the source image remains constant. This constant illumination is ensured because the source image is not deflected and remains essentially aligned with the electron beam column axis. This alignment also provides for maximum edge resolution of the beam spot at the target after conventional demagnification and projection stages.

While the aperture shaping expedient of the present invention is being described with respect to conventional electron beam apparatus using raster scanning of the beam with respect to the target, it should be clear that the expedient is equally applicable to apparatus employing other modes of scanning, e.g., vector scanning.

With such a variable shaped beam, the multiple exposure and consequent "blooming problems" are clearly avoidable. This may be simply understood again with reference to FIG. 2. The overlapped region 28 resulting from the use of the square shaped beam is avoided when the variable shaped beam is used to fill in the illustrative area 27" which is equivalent to area 27. The exposure is achieved in two steps: exposure by a first shaped beam 29 followed by an exposure second shaped beam 30 which abuts the area exposed by beam 29. As may be seen from the accompanying profile of current density, there is no overlap which could lead to increased exposure or "blooming", i.e., total current density at interface 31 between the two exposed areas does not exceed the current density or intensity of illumination of the beam spot which remains constant irrespective of the shape of the beam.

Figure 2:
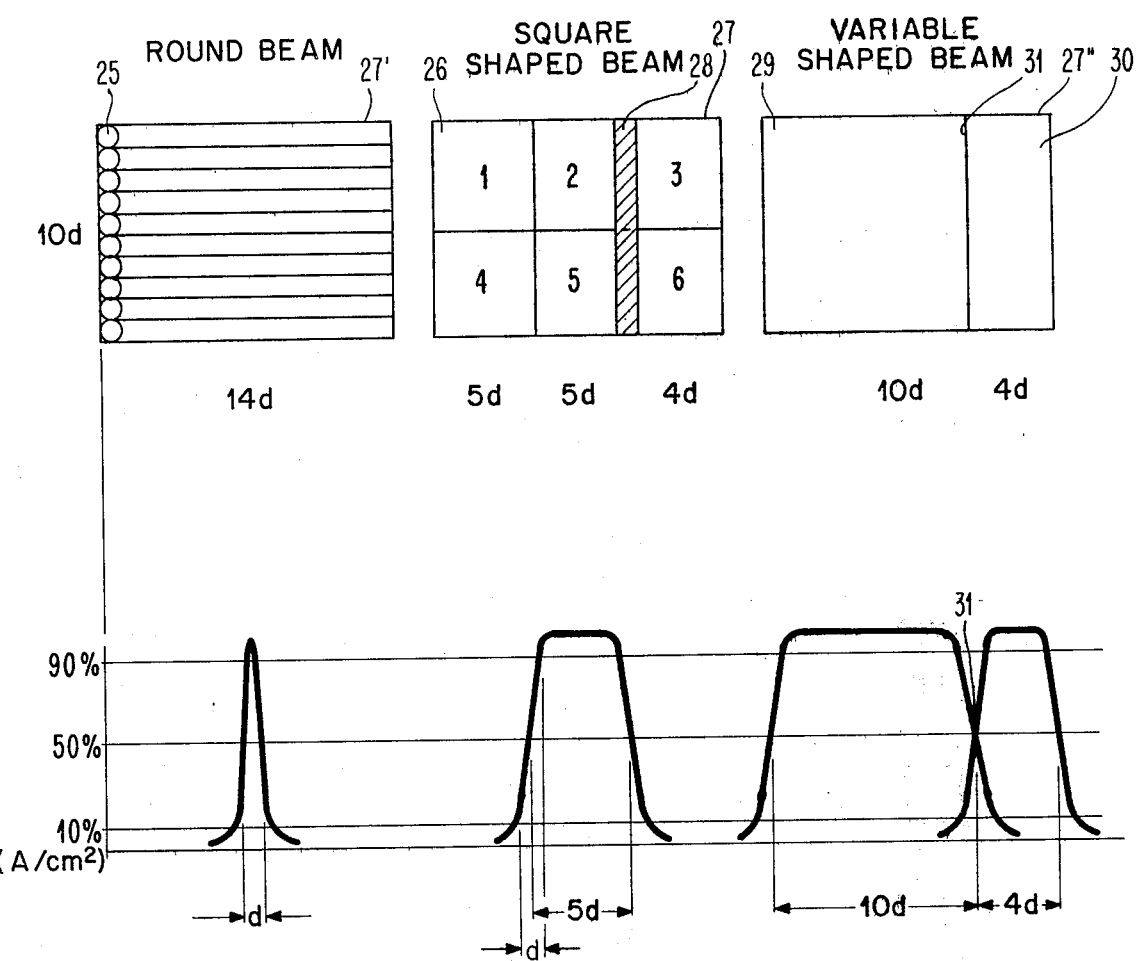
FIG. 2 is a simplified diagrammatic comparison showing the arrangement and number of exposures required to expose a given area with respectively a round beam and a square shaped beam in comparison with the variable shaped beam of the present invention. The figure also shows beam plots of the current density for the round beam spot, the square shaped beam spot and the variable beam spot, respectively.

It should be noted from the beam profiles in FIG. 2 that the resolution of the variable shaped beam remains substantially constant. Resolution is described in the above mentioned Pfeiffer article in *J. Vac. Sci. Technol.* as the half-width of the intensity distribution (d) of a round or Gaussian beam having the selected intensity, i.e., current density. The Pfeiffer article further indicates that the square shaped beam will have the same resolution as the round beam provided that the edge slope of the square shaped beam equals the half-width (d) of the round beam. We have further found with respect to the variable shaped beam that so long as the smallest dimension of the pattern being subjected to stepped exposure by the variable shaped beam is at least five times the resolution (d) of the round shaped beam of the selected intensity, then the pattern will be subject to the same resolution as the one exposed by a plurality of round shaped beams. For example, with reference to FIG. 2, although beam spot 30 has one dimension of only $4d$, the total dimension of the pattern is $14d$. Thus, it will be subject to substantially the same resolution as pattern 27' which is exposed to the round beam.

Figure 3:
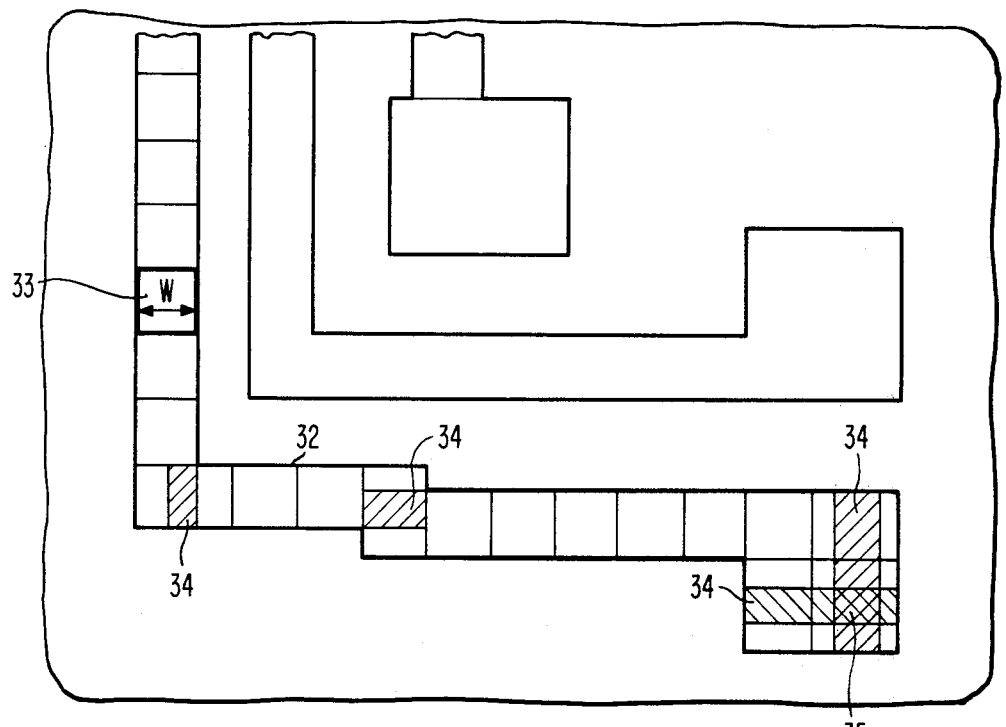
FIG. 3 is a diagrammatic plan view of a portion of an orthogonal rectilinear target pattern showing the exposure steps required in order to fully expose the portion of this pattern utilizing the prior art square beam of fixed dimensions.
Figure 4:
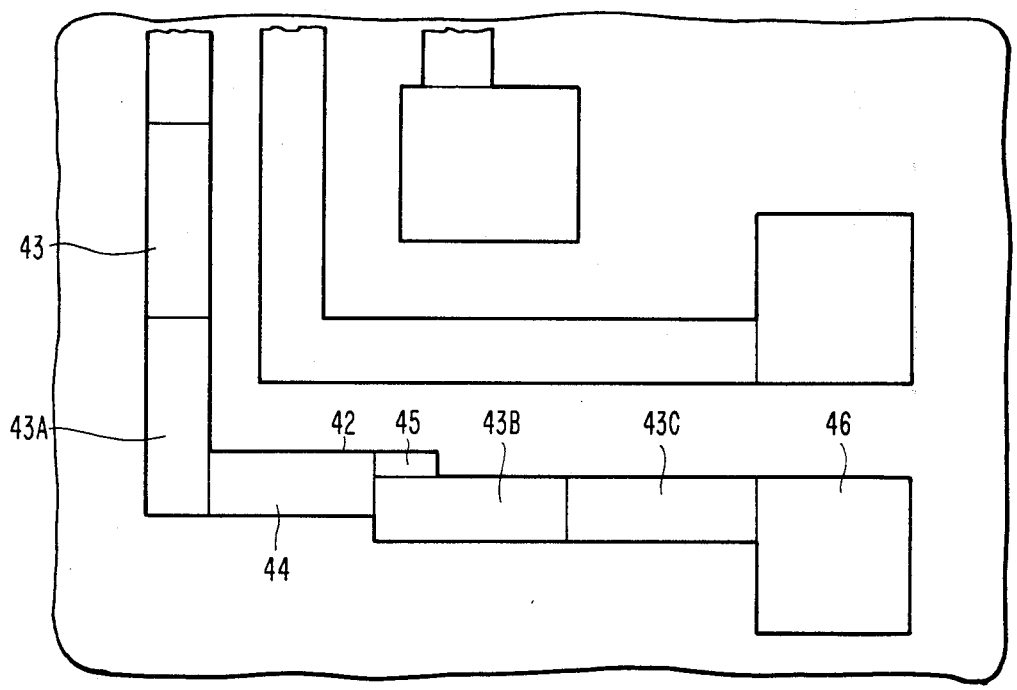
FIG. 4 is the same diagrammatic plan view of the orthogonal rectilinear target pattern modified to show the electron beam exposure steps required when exposing the same portion of the pattern with a variable shaped beam in accordance with the present invention.

The advantages of the variable shaped beam both with respect to the elimination of multiple exposure and increased speeds for exposure, i.e., increased throughput, will be more readily understood with reference to FIGS. 3 and 4. Section 32 in FIG. 3 is the layout of an orthogonal rectilinear pattern to be exposed by an electron beam column. The pattern is to be formed in a photoresist, for example, and is to define metallization lines. If pattern element 32 were to be exposed by a square beam in accordance with conventional practice, this square beam would be limited to a spot 33 having a width, W, which is no greater than the minimum dimension of the entire pattern being exposed. With such a square beam spot 33, it would require twenty-seven stepped exposures to completely expose portion 32 of the pattern. Because of the geometric limitations, areas 34 which are crosshatched would be doubly exposed and at least one region 35 would be quadruply exposed. Such multiple-exposed areas would be subject to "blooming effects".

On the other hand, with reference to FIG. 4, if the portion of the rectilinear pattern 42 which is equivalent in shape and dimensions to pattern portion 32 in FIG. 3 is exposed to a variable shaped beam formed in accordance with the present invention, then only eight exposure steps are necessary to expose the total pattern position. Five different beam shapes would be involved. The first beam shape would be used in exposing areas 43, 43A; a second shape for areas 43B and 43C; a third shaped spot to expose area 44; a fourth shaped spot to expose area 45, and a fifth shaped spot used to expose area 46. The total exposure of pattern portion 42 is accomplished without any overlap; each of the stepped exposed regions abuts the adjacent region. There is no need for any exposed region to overlap the adjacent exposed region. In addition, the total exposure for the same pattern portion is accomplished by the shaped beam apparatus of the present invention in one-fourth as many stepped exposures as with the fixed square shaped aperture. Thus, the total time for exposure of substrate patterns in integrated circuit fabrication would be substantially reduced, thereby greatly enhancing throughput.

Figure 5:
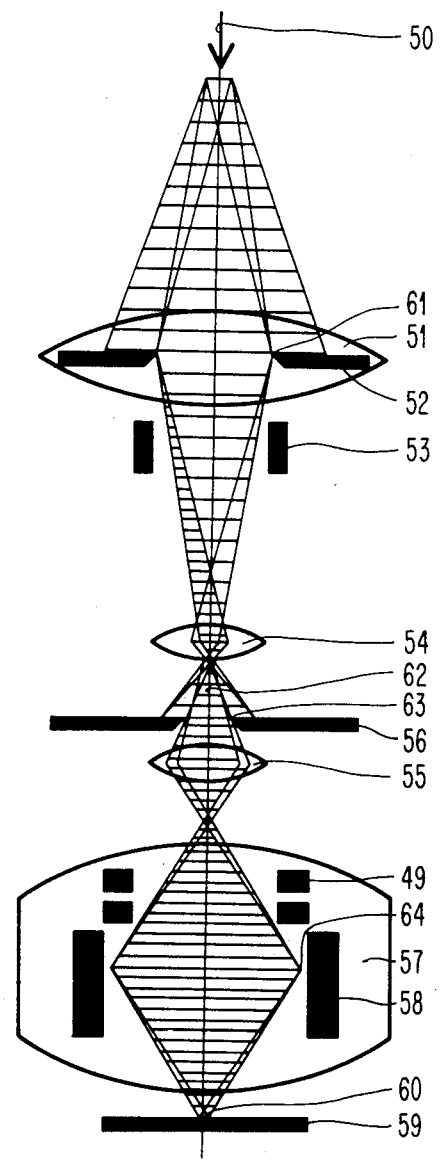
FIG. 5 is a schematic view of a prior art square shaped electron beam apparatus showing a linked-beam trace of the basic imaging concept.
Figure 6:
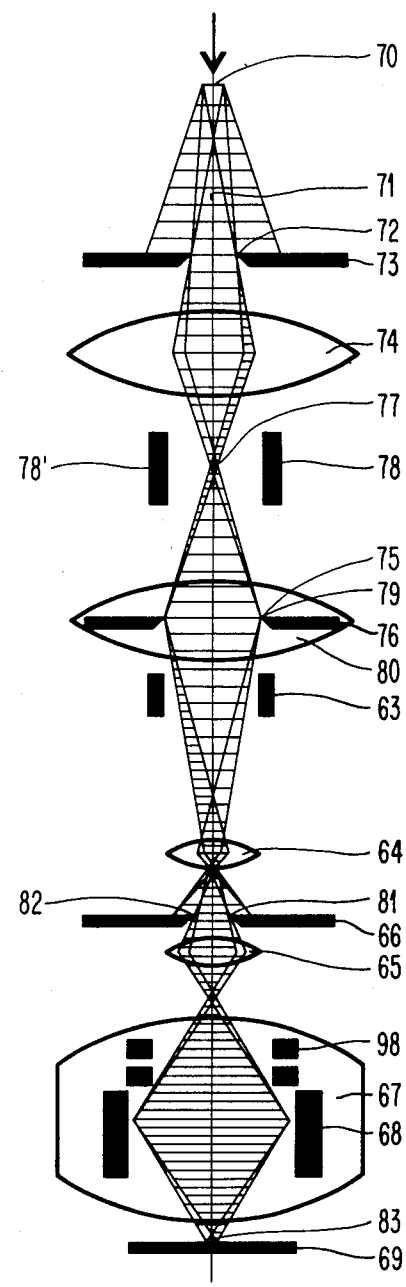
FIG. 6 is a schematic view of the variable shaped electron beam apparatus of the present invention showing an equivalent linked-beam trace for the column operation when there is no deflection.
Figure 7:
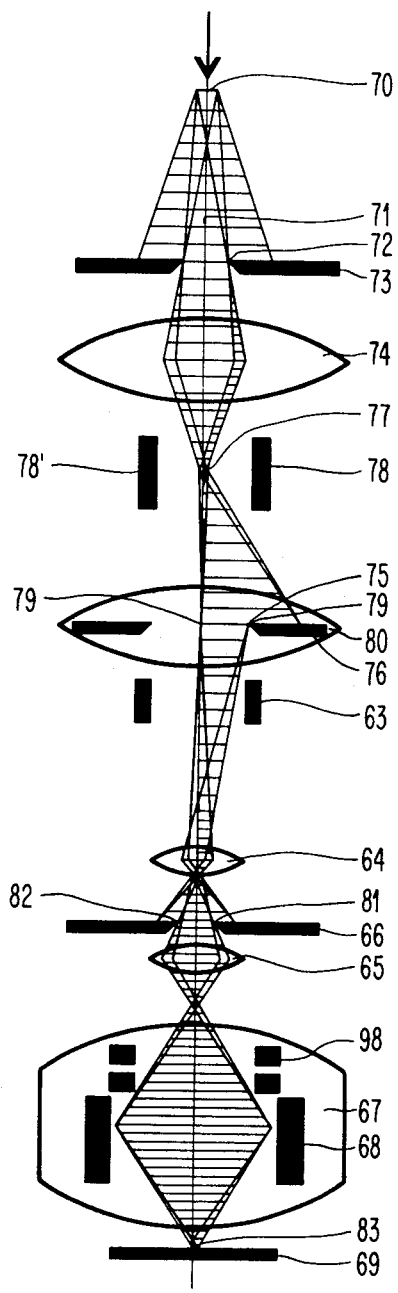
FIG. 7 is the same diagrammatic view of FIG. 6 showing the modification of the linked-beam trace when there is deflection of the image of the first aperture with respect to the second aperture.

The electron beam shaping apparatus of the present invention will be more clearly understood, particularly with respect to the application of principle of optical separation during the beam shaping operation, when reference is made to FIGS. 5, 6 and 7. FIG. 5 which is a diagrammatic view of a conventional electron beam column as described in the above mentioned Pfeiffer article in the *J. Vac. Sci. Technol.* comprises an electron source 50, a condenser lens 51, a square spot shaping aperture 52, blanking plates 53 which operate in the manner described in the manner of U.S. Pat. No. 3,644,700, a demagnification system comprising a first demagnification lens 54 and a second demagnification lens 55. The apparatus further includes a circular aperture plate 56 for defining the axial portions of the beam which have the maximum intensity in the manner described in U.S. Pat. No. 3,644,700 as well as a standard projection lens 57 having a central deflection yoke 58 and standard dynamic elements 49 for correcting field curvature and axial and deflection astigmatism. This projection lens and yoke are a standard structure as described in detail in the Pfeiffer article. They may also have the structure described in U.S. Pat. Nos. 3,930,181 or 3,984,687.

The column directs a beam at a target 59, e.g., photoresist covered semiconductor wafer on which a rectilinear pattern is to be exposed.

The linked-beam trace showing FIG. 5 is the same as that shown in the above mentioned Pfeiffer article. The design of the column in FIG. 5 optimizes the beam current density, i.e., intensity distribution, simultaneously with the square shaping of the spot by implementing the linked-beam imaging concept of A. Koehler, Z. *Wiss. Mikroskopie*, 10, 433 (1893), further described in H. C. Pfeiffer and K. H. Loeffler, *Proceedings of the* 7th *International Conference on Electron Microscopy*, Grenoble (1970), p. 63. As drawn linked-beam trace shows, condenser lens 51 images the source 50 into the entrance pupil of the first demagnification lens 54 of the demagnification section, to thereby provide the most efficient and uniform illumination for the beam, i.e., constant current density. (The trace of the source beam is indicated by the widely spaced cross lines while the projection of the image of square aperture 52 as indicated by the narrow spaced cross lines.) Projection lens 57 generates the electron beam spot 60 by projecting the image of aperture 52 demagnified by demagnification lenses 54 and 55 onto the target wafer 59.

In the prior art structure of FIG. 5, the condenser lens 51 and the projection lens 57 are the critical elements of the respective square aperture image and source beam tracing; demagnification lenses 54, 55 establish the link between the condenser lens 51 and the projection lens 57. The square aperture 61 which is being imaged to form the beam spot is formed in a thin metal plate 52. In the apparatus shown, the image of square aperture 62 is demagnified in two steps through lenses 54, 55. For example, with an aperture 61 in the order of 400 microns square, the demagnification system will reduce to a final beam spot about 2.5 microns square. While the image of aperture 61 is being thus demagnified, the first demagnification lens 54 simultaneously creates a magnified image of the source in the plane of circular aperture 63 centered about the electron beam column axis 62. The second demagnification lens 55 images the round aperture 63 at the center 64 of the projection lens and defines the semi-angle of convergence. Thus, uniform beam current density is provided since circular aperture 63 admits only the central or axial portion of the source beam trace which minimizes aberrations. For a given round aperture size, the second demagnification lens determines the final beam convergence angle and consequently the required brightness, e.g., about $3 \times 10^5$ A/cm$^2$-sterad is necessary to achieve a target current of 3 microamps. The final or projection lens provides the required working distance deflection yoke 58 in order that the beam may be deflected over the target field to be exposed which is in the order of 5 millimeters square. The beam is deflected by a conventional deflection yoke. During the writing of patterns by a stepped electron beam, the intensity of the beam spot 60 may be modulated by electrostatic beam blanking plates 53 which operate essentially in the manner described in U.S. Pat. No. 3,644,700.

Referring now to FIG. 6, the operation of the beam shaping apparatus of the present invention will be described by showing the trace of the linked-beam concept by which optimum optical separation of the source beam from the shaping aperture image is achieved. As will be seen, such separation is highly desirable in that it permits a uniform current density irrespective of the shape of the spot. In the column of FIG. 6, the lower portion of the apparatus has substantially the same structure and operational characteristics as the apparatus described in FIG. 5. First and second demagnification lenses 64 and 65 are respectively equivalent to demagnification lenses 54 and 55 in FIG. 5. Round aperture plate 66 is substantially the same as round aperture plate 56 in FIG. 5. Projection lens 67 performs the same function as lens 57 in FIG. 5, deflection yoke 68 performs the equivalent function of deflection yoke 58 in FIG. 5, and dynamic correction elements 98 perform the same functions as elements 49 in FIG. 5. Target 69 is a photoresist wafer on which a rectilinear pattern is to be formed. Also, blanking plates 63 in the column of FIG. 6 performs the conventional blanking function as described with respect to plates 53 in FIG. 5.

In performing the beam shaping function of the present invention which was previously described in general with respect to FIG. 1, source 70 directs a beam of electrons along the axis of the electron beam column 71. Following the imaging concept used in FIG. 5 and in the Pfeiffer article in the *J. Vac. Sci. Technol.*, the trace of the source imaging is indicated by the widely spaced cross lines while the trace of the first aperture image and of the composite image formed by the first and second apertures is shown by the narrow spaced cross lines. The beam is shaped into a variable rectangular spot by first passing the beam through a square aperture 72 formed in plate 73. Condenser lens 74 which may suitably be a magnetic lens of conventional design in the electron beam art, performs two functions. It focuses an image of aperture 72 in the plane of square aperture 75 formed in plate 76. In addition, condenser lens 74 focuses the image 77 of source 70 at a point along the axis and in the center of the image deflection means provided by electrostatic plates 78 and 78'. This pair of plates has the capability of deflecting the focused image 79 of the first square aperture 72 with respect to second square aperture 75 during the beam shaping operation. There is, of course, a second pair of plates not shown in FIG. 6 but shown in FIG. 1 which act to deflect the beam laterally in the other orthogonal direction during the shaping operation. The deflection of the image 79 of the first aperture with respect to the second aperture 75 is shown in FIG. 7. For the optimum operation of the electron beam column of the present invention, the focused image 77 of source 70 must be at the virtual center of deflection of the deflection means provided by electrostatic plates 78 and 78' as well as the corresponding pair of plates for deflection in the other orthognonal direction. The focal length of lens 74 is determined primarily to focus the aperture image 79 in the plane of aperture 75. Therefore, the attendant focusing of source image 77 will not necessarily occur at the center of deflection. While it may be possible to move deflection plates 78 and 78' along the axis of the column to position source image 77 at the center of deflection, this is not considered to be very practical. There will subsequently be described with respect to FIGS. 8 and 9 a suitable expedient for moving the center of deflection of an electrostatic deflection system into coincidence with the plane of the focused image 77 of the source without physically moving plates 78 and 78'.

The significance of having the source image 77 at the center of deflection becomes apparent when one considers the action of condenser lens 80 which may be any standard magnetic condenser lens within which the second aperture plate 76 is disposed. Condenser lens 80 acts to image source image 77 into the entrance pupil of the first demagnification lens 64 in much the same manner that condenser lens 51 in FIG. 5 acted to image the source itself, 50, into the entrance pupil of first demagnification lens 54. When a voltage differential is applied between electrostatic plates 78 and 78' in order to deflect the image 79 of the first aperture with respect to the second aperture 75 as shown in FIG. 7 (FIG. 7 is a schematic of the linked-beam trace of the column of FIG. 6 showing the trace where the deflection apparatus operates to deflect), source image 77 is not deflected; it remains stationary because it is at the center of deflection. Consequently, irrespective of the deflection of aperture image 79 in the X or Y direction, focused source image 77 remains stationary, and the image of source image 77 projected by condenser lens 80 into the entrance pupil of first demagnification lens 64 will remain constant in position at the axis of column 71.

The demagnification system and projection system of the column in FIG. 6 act on the composite image determined by laterally deflected image 79 and aperture 75 in essentially the same manner that the demagnification and projection system of FIG. 5 acted upon the image of square aperture 61. Thus, in the columns of FIGS. 6 and 7, the composite image is demagnified in two steps through demagnification lenses 64 and 65. (In FIG. 6, the composite image is identical with the second aperture 75.) While the composite image is being thus demagnified, first demagnification lens 64 simultaneously creates a magnified image of the source in the plane of circular aperture 81. This image of the source is, of course, dependent on the position of source image 77. Since source image 77 remains stationary irrespective of the deflection in forming the composite aperture image, focused image 82 of the source remains centered about the column axis at aperture 81. Thus, substantially uniform current density is provided by circular aperture 81 which admits only the central or axial portion of the Gaussian source being traced and minimizes aberrations generated in the final lens.

The second demagnification lens 65 and projection lens 67 operate in the same fashion as lenses 55 and 57 in FIG. 5 in accomplishing this. Likewise, deflection yoke 68 provides for the deflection of the composite beam spot 83 across the target field in the manner previously described with respect to yoke 58 of FIG. 5. In addition, since the image of the source projected upon the entrance pupil of demagnification lens 64, will be centered about the axis irrespective of the deflection, only the central portions of the lenses in the demagnification system and of the projection lens will be primarily utilized. Thus, degradation of beam spot edge resolution which would result if the source image projected upon demagnification and projection lenses were off center is avoided. It should be noted that this latter effect is significant in systems which do not utilize a round beam forming aperture like aperture 81.

In this connection, it should be noted that in electron beam columns, it is possible to eliminate physical apertures like round aperture 81 which restricts the beam diameter in the demagnification and projection stages of the column by using properly scaled images of the source itself. However, the scaled image approach has its shortcomings in that there is non-uniform current density distribution of the source which leads to higher aberrations for the same total beam current or brightness.

Figure 8:
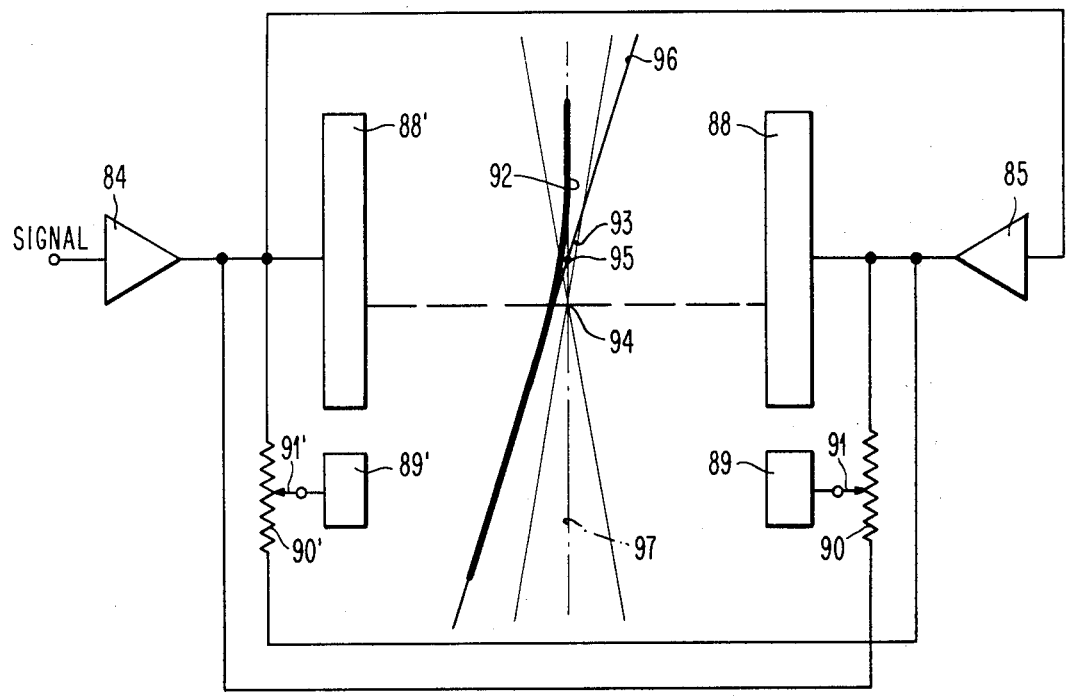
FIG. 8 is a schematic diagrammatic view of deflection apparatus which may be utilized to laterally deflect the image of the first aperture during beam spot shaping.
Figure 9:
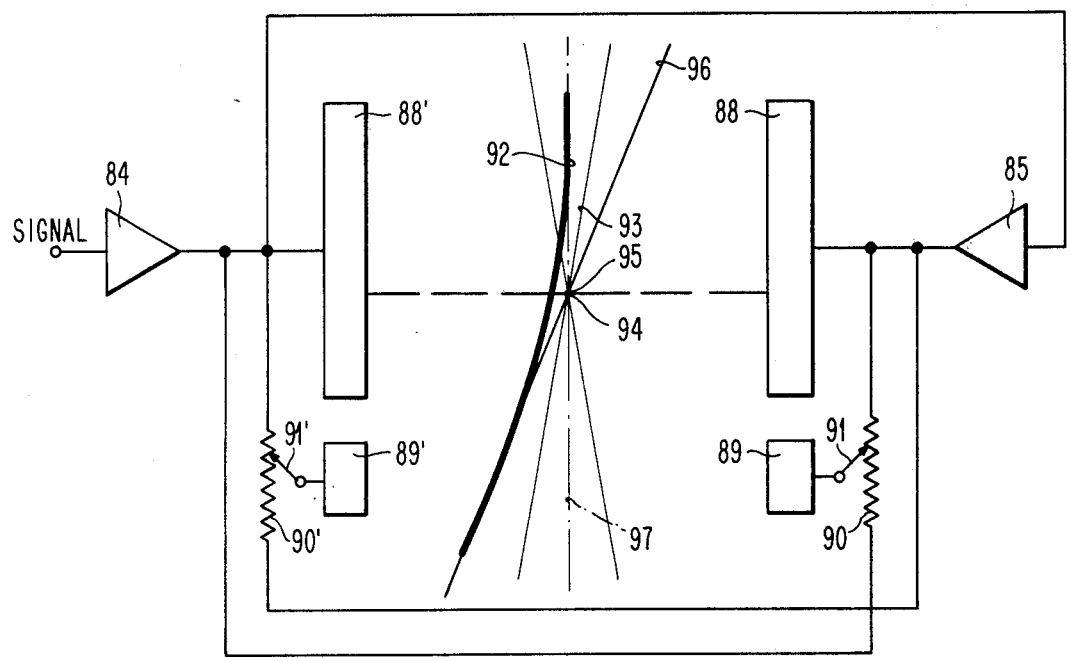
FIG. 9 is the same view of the apparatus of FIG. 8 showing the operational modifications in moving the virtual center of deflection into coincidence with the plane of the focused source image.

Referring now to FIGS. 8 and 9, apparatus in accordance with the present invention associated with the deflection means is provided for moving the center of deflection into coincidence with the plane in which the source image is focused. The apparatus will be described with respect to one pair of electrostatic deflection plates 88 and 88'. However, it should be understood that the same adjustment may be made with the pair of electrostatic deflection plates which move the aperture laterally in the other direction. The movement of the center of deflection into coincidence with the plane in which the image of the source is focused is customarily carried out before the apparatus is actually in operation. It may be conveniently accomplished during the calibration period that is described in U.S. Pat. No. 3,644,700 for an electron beam column. Once the center of deflection is adjusted into coincidence with the focused source image, the further modification should usually be unnecessary during the operation of the electron beam column irrespective of the number or nature of lateral deflections carried out to change the beam spot shape during the normal operation.

With reference first to FIG. 8, the voltage differential between plates 88 and 88' is provided by the conventional push-pull circuit through which deflection is achieved by applying a signal to amplifier 84, the output of which is applied to plate 88' and to amplifier 85. The level and the sense (positive or negative) of the signal will determine the extent of deflection. The output of amplifier 85 is, in turn, applied to plate 88 to provide a push-pull circuit in which the voltage level of plate 88 swings negative when plate 88' is positive and vice versa. This portion of the structure represents a conventional arrangement for developing the voltage differential between a pair of electrostatic plates. In addition, the present structure comprises a pair of auxiliary plates 89 and 89'. Auxiliary plates 89 and 89' are each connected to the outputs of amplifiers 84 and 85 respectively through the variable resistors 90 and 90'. Thus, let us consider the initial condition, shown in FIG. 8 when a differential voltage is applied between primary plates 88 and 88'. Since the contacts 91 and 91' respectively between plates 89 and 89' and balanced resistors 90 and 90' are centered with respect to such resistors, plates 89 and 89' will be at the identical voltage level (half-way between voltage levels of plates 88 and 88'), and the deflection of the path of the first aperture image diagrammatically represented by line 92 will be deflected as shown. Also, as the beam trace 93 of the source image indicates, the source image will be focused at point 94. The virtual center of deflection 95 of the apparatus is determined by the intercept of the extension 96 of the beam path as deflected and axis 97 which was the original path of beam 92 before deflection.

Because it is desired that the center of deflection be moved into coincidence with the focused beam at 94, the apparatus will be adjusted as indicated in FIG. 9 to bring such coincidence about. Since the center of deflection 95 produced by voltage drop between primary plates 88 and 88' is above focused image 94 of the source, the center of deflection 95 is moved down by applying a potential difference between auxiliary plates 89 and 89' in the same sense as the potential difference between primary plates 88 and 88', i.e., if primary plate 88' has a positive voltage with respect to plate 88, then plate 89' is made positive with respect to plate 89. This is accomplished by moving variable resistor contact 91' as indicated in FIG. 9 so that the portion of variable resistor 90' between plates 89' and 88' is reduced to move the voltage level of plate 89' toward that of plate 88'. Similarly, variable resistor contact 91 is moved to the position indicated to reduce the portion of variable resistor 90 between plate 89 and plate 88 whereby voltage level on plate 89 approaches that of plate 88. This shifts the path 92 of the aperture image as shown whereby extension 96 crosses axis 97 as shown to produce a virtual center of deflection 95 in coincidence with focus source image 94.

Conversely, if it is desired to move the center of deflection 95 upward, then variable resistor contact 91' is moved to increase the resistance between auxiliary plate 89' and primary plate 88' and to thus diminish the resistance between auxiliary plate 89' and primary plate 88. At the same time, variable resistor contact 91 may be moved to increase the resistance between auxiliary plate 89 and primary plate 88, and to thus diminish the resistance between auxiliary plate 89 and primary plate 88'. As a result, a voltage drop is produced between auxiliary plates 89 and 89' which is in the opposite sense to the voltage drop between the primary plates. This has the effect of bucking or opposing the deflection action of the primary plates and thereby moving the center of deflection upward.

In suitable operating conditions, for the deflection apparatus of FIGS. 8 and 9, the voltage drop which may be applied between auxiliary plates 89 and 89' may be in the order of about ten percent of the voltage drop across the primary plates, e.g., when the voltage swing between the primary plates is in the order of about twenty volts, the voltage swing between the auxiliary plates would be in the order of about two volts.

While the description in FIGS. 8 and 9 was directed to moving the center of deflection with respect to means for deflecting the aperture image in one lateral direction, similar center of deflection adjusting apparatus may be used in connection with the electrostatic deflection plates which deflect the beam in the other lateral direction.

As a practical matter, the movement of the center of deflection into coincidence with the focused image of the source is accomplished during electron beam calibration by first measuring the current density of the shaped beam spot at the target using any standard measurement technique under conditions where there is no lateral deflection of the first aperture image with respect to the second beam shaping aperture. Then, if the center of deflection is coincident with the source image, the current density will remain constant irrespective of the lateral deflection of the first aperture image in the X and Y directions. Accordingly, after the initial reading as to current density, the first aperture image is deflected in the X and/or Y direction and the auxiliary plates are "tuned" by moving variable resistor contacts 90 and 91' until the constant current density at the initial level is achieved. This indicates that the center of deflection of the deflection means is in coincidence with the source image. Once this coincidence is achieved by the initial "tuning", the current should remain constant thereafter. No additional changes should be necessary during the operation of the electron beam column when the beam shape is changed from step to step. Thus, the apparatus of the present invention, provides for rapid change in beam aperture size and shape during the electron beam column operation to effectively expose rectilinear regions in a target without any multiple exposure or exposure overlap and with increased throughput.

Although electrostatic deflection apparatus has been disclosed for the preferred embodiment as the means for deflecting the image of the first aperture and for moving the center of deflection, it will be clear that other deflection apparatus such as magnetic deflection apparatus may be used for the same purpose.

While the invention has been particularly shown and described with reference to the preferred embodiments thereof, it will be understood by those skilled in the art that various changes in form and details may be made therein without departing from the spirit and scope of the invention.

We claim:

1. In electron beam apparatus having a source of electrons for providing an electron beam adapted for generating integrated circuit patterns upon a target positioned in a target area toward which said electron beam is directed, electron beam forming means along the path from said source to said target area comprising:
    a first beam shaping member having a first spot shaping aperture formed therein,
    a second beam shaping member having a second spot shaping aperture formed therein;
    means for focusing the image of said first aperture in the plane of said second spot shaping aperture to thereby form a composite spot shape defined by said image and said second aperture,
    means for focusing the image of said composite spot in the plane of said target,
    means for focusing the image of said source in a plane between said source and said image of said first aperture,
    means for deflecting said electron beam, so as to deflect said image of said first aperture laterally with respect to said second aperture to thereby vary the shape and dimensions of said composite spot selectively to enable imaging of variable shapes upon said target, and
    means for locating the focused image of said source in a plane substantially perpendicular to said path and coincident with the virtual center of said deflection.

2. The apparatus of claim 1 wherein said first and second apertures have the same rectangular shape.

3. The apparatus of claim 2 wherein said focused image of said first aperture has the same dimensions as said second aperture.

4. The apparatus of claim 1 wherein said deflection means are electrostatic deflection means positioned along said path between said first and second apertures.

5. The apparatus of claim 4 wherein said electrostatic deflection means comprise at least one pair of primary plates spaced from and facing eath other in a first lateral direction across said beam path and means for applying a voltage between said plates.

6. The apparatus of claim 1 wherein the image of said source is focused in a plane proximate to the center of said deflection means and said locating means including means for moving the virtual center of said electrostatic deflection toward coincidence with said source image plane.

7. The apparatus of claim 6 wherein said means for moving said center of deflection comprises:
    a pair of auxiliary plates spaced from and facing each other across the beam path so as to provide a deflection in the same direction as said primary plates at a position adjacent to but spaced from said primary plates, and
    means for applying a variable voltage between said auxiliary plates to thereby provide a resultant virtual center of deflection in coincidence with said source image plane.

8. The apparatus of claim 5 wherein said electrostatic deflection means comprise a second pair of primary plates spaced from and facing each other in a second lateral direction across the beam path and means for applying a voltage between said second pair of plates.

9. The apparatus of claim 8 wherein said locating means includes means for moving said center of deflection comprising:
    first and second pairs of auxiliary plates, respectively spaced from and facing each other so as to provide deflection in the same directions of said first and second pairs of primary plates at positions respectively adjacent to but spaced from said primary plates, and
    means for applying variable voltages between said respective pairs of auxiliary plates to thereby provide a resultant virtual center of deflection in coincidence with said source image plane.

10. The apparatus of claim 5 further including means for maintaining a constant current density of the image at said target area irrespective of the shape and dimensions of said composite spot comprising:
    a pair of auxiliary plates spaced from and facing each other across the beam path so as to provide deflection in the same direction as said primary plates at a position adjacent to but spaced from said primary plates,
    means for applying a variable voltage across said auxiliary plates, and
    means for varying said voltage between said auxiliary plates to thereby maintain a constant current density.

11. In a method for directing a beam of electrons along a path from an electron source against a target positioned within a target area for the purpose of generating integrated circuit patterns upon said target, the steps comprising:
    shaping said beam by directing said beam through a first spot shaping aperture,
    focusing the image of said first aperture in the plane of a second spot shaping aperture to thereby form a composite spot shape defined by said image and said second aperture, focusing the image of said source between said souce and said image of said first aperture,
    deflecting said image of said first aperture laterally with respect to said second aperture to thereby vary the shape and dimensions of said composite spot selectively to enable imaging of variable shapes upon said target,
    locating the focused image of said souce in a plane substantially perpendicular to said path and coincident with the virtual center of said deflection, and
    focusing the image of said composite spot upon said target.

12. The method of claim 11 wherein said first and second apertures have the same rectangular shape.

13. The method of claim 12 wherein said focused image of said first aperture has the same dimensions as said second aperture.

14. The method of claim 13 wherein said first aperture image is deflected electrostatically in a lateral direction by applying a primary voltage across the path of the electron beam at a position before the second aperture.

15. The method of claim 14 including the further steps of focusing the image of said source and moving the virtual center of said electrostatic deflection and said source image plane toward coincidence.

16. The method of claim 15 wherein said virtual center of deflection and said source image plane are moved toward coincidence by applying an auxiliary voltage across said path so as to provide deflection in the same direction as said primary voltage.

17. The method of claim 16 wherein said auxiliary voltage is applied in the opposite sense to that of the primary voltage to thereby move the resultant center of deflection in one direction along said beam path.

18. The method of claim 17 wherein said auxiliary voltage is applied in the same sense as that of the primary voltage to thereby move the resultant center of deflection in an opposite direction along said beam path.

19. The method of claim 15 wherein an auxiliary voltage is applied across said path so as to provide a deflection in the same direction as said primary voltage to thereby maintain a constant current density of the beam at said target.

20. In an electron beam apparatus having electron beam forming means for varying the shape and dimensions of an electron beam adapted for generating integrated circuit patterns upon a target, wherein said apparatus includes a source of electrons for providing an electron beam along a path from the source to a target, a first beam shaping member having a first aperture formed therein, a second beam shaping member having a second aperture formed therein, means for focusing the image of the source in a plane between the source and the image of the first aperture, means for focusing the image of a composite spot formed by the first aperture and the second aperture in the plane of the target, and means for deflecting the electron beam so as to deflect the image of the first aperture laterally with respect to the second aperture to thereby vary the shape and dimensions of the composite spot selectively, the improvement comprising means for locating the focused image of the source in a plane substantially perpendicular to said beam path and coincident with the virtual center of said deflection.

21. The apparatus of claim 20 wherein said first and second apertures have the same rectangular shape.

22. The apparatus of claim 20 wherein said aperture image deflection means are electrostatic deflection means positioned along said path between said first and second apertures.

23. The apparatus of claim 22 wherein said electrostatic deflection means comprise at least one pair of primary plates spaced from and facing each other in a first lateral direction across said beam path and means for applying a voltage between said plates.

24. The apparatus of claim 23 wherein the image of said source is focused in a plane proximate to the center of said deflection means and further including means for moving the virtual center of said electrostatic deflection and said source image plane toward coincidence.

25. The apparatus of claim 24 wherein said means for moving said center of deflection comprises a pair of auxiliary plates spaced from and facing each other across the beam path so as to provide a deflection in the same direction as said primary plate at a position adjacent to but spaced from said primary plate, and means for applying a variable voltage between said auxiliary plates to thereby provide a resultant virtual center of deflection in coincidence with said source image plane.

26. The apparatus of claim 23 or 25 wherein said electrostatic deflection means comprise a second pair of primary plates spaced from and facing each other in a second lateral direction across the beam path and means for applying a voltage between said second pair of plates.

27. The apparatus of claim 26 wherein said means for moving said center of deflection comprises first and second pairs of auxiliary plates, respectively spaced from and facing each other so as to provide deflection in the same directions of said first and second pairs of primary plates at positions respectively adjacent to but spaced from said primary plates, and means for applying variable voltages between said respective pairs of auxiliary plates to thereby provide a resultant virtual center of deflection in coincidence with said source image plane.

28. The apparatus of claim 23 further including means for maintaining a constant current density of the image at said target area irrespective of the shape and dimensions of said composite spot comprising:

a pair of auxiliary plates spaced from and facing each other across the beam path so as to provide deflection in the same direction as said primary plates at a position adjacent to but spaced from said primary plates, means for applying a variable voltage across said auxiliary plates, and means for varying said voltage between said auxiliary plates to thereby maintain a constant current density.

* * * * *

UNITED STATES PATENT AND TRADEMARK OFFICE
CERTIFICATE OF CORRECTION

PATENT NO. : 4,243,866
DATED : January 6, 1981
INVENTOR(S) : HANS C. PFEIFFER ET AL It is certified that error appears in the above—identified patent and that said Letters Patent is hereby corrected as shown below:

| | |
|---|---|
| Column 2, line 23 | After "entire" insert --pattern--; |
| Column 2, line 25 | "twentyfive" should be --twenty-five--; |
| Column 4, line 19 | After "combined" "apparatus" should be --apertures--; |
| Column 7, lines 29/30 | "position" should be --portion--; |
| Column 8, line 15 | After "as" insert --the--; |
| Column 8, line 36 | "62" should be --61--; |
| Column 13, line 56 (Claim 5) | "eath" should be --each--. |

Signed and Sealed this

Twenty-third Day of August 1983

[SEAL]

Attest:

GERALD J. MOSSINGHOFF

Attesting Officer    Commissioner of Patents and Trademarks